US009762352B2

United States Patent
Li et al.

(10) Patent No.: US 9,762,352 B2
(45) Date of Patent: Sep. 12, 2017

(54) DECODING METHOD AND RECEIVING APPARATUS IN WIRELESS COMMUNICATION SYSTEM

(71) Applicant: HUAWEI TECHNOLOGIES CO., LTD., Shenzhen, Guangdong (CN)

(72) Inventors: Bin Li, Shenzhen (CN); Wen Tong, Kanata (CA); Hui Shen, Shenzhen (CN); Yuchen Shi, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/191,533

(22) Filed: Jun. 24, 2016

(65) Prior Publication Data

US 2016/0308643 A1    Oct. 20, 2016

Related U.S. Application Data

(63) Continuation of application No. PCT/CN2013/090285, filed on Dec. 24, 2013.

(51) Int. Cl.
*H03M 13/11*    (2006.01)
*H04L 1/00*    (2006.01)
(Continued)

(52) U.S. Cl.
CPC ....... *H04L 1/0054* (2013.01); *H03M 13/1105* (2013.01); *H03M 13/13* (2013.01); *H04B 7/0413* (2013.01); *H04W 88/02* (2013.01)

(58) Field of Classification Search
CPC .. H03M 13/1105; H03M 13/00; H03M 13/13; H04L 1/0064; H04L 1/0054; H04B 7/0413; H04W 88/02
See application file for complete search history.

(56) References Cited

U.S. PATENT DOCUMENTS 4,583,194 A    4/1986  Cage
6,594,792 B1    7/2003  Hladik et al.
(Continued)

FOREIGN PATENT DOCUMENTS

CN    101707510 A    5/2010
CN    101777924 A    7/2010
(Continued)

OTHER PUBLICATIONS

Camille Leroux et al. "A Semi-Parallel Successive-Cancellation Decoder for Polar Codes", IEEE Transactions on Signal Processing, vol. 61, No. 2, Jan. 15, 2013, total 11 pages.
(Continued)

*Primary Examiner* — Jean B Corrielus
(74) *Attorney, Agent, or Firm* — Huawei Technologies Co., Ltd.

(57) ABSTRACT

A method for decoding Polar codes includes: receiving a Polar code having a length of N, and dividing the Polar code into m subcodes that are coupled to each other, each subcode has a length of N/m, and each of N and m is an integer powers of 2; calculating squared Euclidean distances of input bits in the m subcodes, to obtain minimum squared Euclidean distances of the input bits that are independent of each other; obtaining, accordingly a minimum squared Euclidean distance of input bits that are coupled to each other in the m subcodes; and obtaining input bits that are in the m subcodes and that meet the independent minimum squared Euclidean distances and the combined minimum squared Euclidean distance, and obtaining a decoding result of the Polar code with reference to relationships between the m subcodes and the Polar code.

14 Claims, 8 Drawing Sheets

(51) Int. Cl.
*H03M 13/13* (2006.01)
*H04B 7/0413* (2017.01)
*H04W 88/02* (2009.01)

(56) References Cited

U.S. PATENT DOCUMENTS

| | | | |
|---|---|---|---|
| 7,218,677 B2 | 5/2007 | Otsuka | |
| 2009/0103641 A1* | 4/2009 | Masui | H04L 25/0206 375/260 |
| 2011/0261908 A1 | 10/2011 | Chiang et al. | |
| 2013/0111291 A1 | 5/2013 | Ma | |
| 2013/0117344 A1 | 5/2013 | Gross et al. | |
| 2013/0283116 A1 | 10/2013 | Arikan | |
| 2014/0365842 A1 | 12/2014 | Li et al. | |
| 2015/0026543 A1 | 1/2015 | Li et al. | |
| 2015/0188641 A1* | 7/2015 | Awadalla | H04B 10/612 398/202 |
| 2015/0381208 A1 | 12/2015 | Li et al. | |

FOREIGN PATENT DOCUMENTS

| | | |
|---|---|---|
| CN | 102122966 A | 7/2011 |
| CN | 102394663 A | 3/2012 |
| CN | 103220001 A | 7/2013 |
| CN | 103368583 A | 10/2013 |
| CN | 104038234 A | 9/2014 |
| CN | 104124979 A | 10/2014 |
| KR | 20080048971 A | 6/2008 |
| KR | 20130001494 A | 1/2013 |

OTHER PUBLICATIONS

Guohui Wang et al. "High Throughput Low Latency LDPC Decoding on GPU for SDR Systems", IEEE,GlobalSIP 2013, total 4 pages.
E. Arikan, "Channel polarization: A method for constructing capacityachieving codes for symmetric binary-input memoryless channels," IEEE Trans. Inform. Theory, vol. 55, No. 7, pp. 3051-3073, Jul. 2009. total 23 pages.
I. TalA. Vardy, "List Decoding of Polar Codes", in Proc of ISIT IEEE 2011. total 5 pages.
Viveck R. Cadambe et al. "Interference Alignment and Spatial Degrees of Freedom for the K User Interference Channel", ICC 2008, total 5 pages.
Bin Li et al. "Low-Latency Polar Codes via Hybrid Decoding", 2014 8th international Symposium on turbo Codes and Iterative Information Processing(ISTC). 2014. total 5 pages.
Mathis Seidl et al. Improving Successive Cancellation Decoding of Polar Codes by Usage of Inner Block Codes. 2010 6th international symposium on turbo codes & iterative information processing. Sep. 10, 2010. total 4 pages.
Alptekin Pamuk: An FPGA implementation architecture for decoding of polar codes, 2011 8th International Symposium on Wireless Communication Systems,Nov. 6, 2011. total 5 pages.
Bin Li et al.: "Parallel Decoders of Polar Codes", Sep. 4, 2013. total 4 pages. Retrieved from the Internet: http://arvix.org/ftp/arvix/papers/1309/1309.1026.pdf.
Camille Leroux et al., Hardware Architectures for Successive Cancellation Decoding of Polar Codes, 2011 IEEE International Conference on Acoustics, Speech and Signal Processing (ICASSP), May 27, 2011, pp. 1665 to 1668. total 6 pages.
Chuan Zhang et al., Reduced-Latency SC Polar Decoder Architectures, IEEE ICC 2012 Signal Processing for Communications Symposium, Jun. 15, 2012, pp. 3471 to 3475. total 7 pages.
Ryuhei Mori, On Polar Codes, Technical Research Report of Institute of Electronics, Information and Communication Engineers, Sep. 14, 2010, vol. 110, No. 205, pp. 43 to 49, IT2010-41. total 8 pages. with English translation.
A. Mishra et al .,"A Successive Cancellation Decoder ASIC for a 1024-bit Polar Code in 180 nm CMOS", IEEE Asian Solid-State Circuits Conference, Nov. 12-14, 2012, pp. 205-208.
Amin Alamdar-Yazdi et aL, "A Simplified Successive-Cancellation Decoder for Polar Codes", IEEE Communications Letters vol. 15, No. 12, Dec. 2011, pp. 1378-1380.
Kai Niu et al., "New Repetition Polar Code over Double Blocks for the BEC Channel", IEEE Wireless Information Technology and Systems, 2012 IEEE International Conference, Nov. 2012, 4 pages.
Kahraman Sinan et al:" folded tree maximum-likelihood decoder for kronecker product-based codes", Oct. 2, 2013, XP32565227, total 8 pages.
P. Trifonov, "Efficient Design and Decoding of Polar Codes," in IEEE Transactions on Communications, vol. 60, No. 11, pp. 3221-3227, Nov. 2012.
S. Kahraman and M. E.gelebi, "Code based efficient maximum-likelihood decoding of short polar codes," 2012 IEEE International Symposium on Information Theory Proceedings, Cambridge, MA, 2012, pp. 1967-1971.

* cited by examiner

DECODING METHOD AND RECEIVING APPARATUS IN WIRELESS COMMUNICATION SYSTEM

CROSS REFERENCE TO RELATED APPLICATIONS

This application is a continuation of International Application No. PCT/CN2013/090285, filed on Dec. 24, 2013, which is hereby incorporated by reference in its entirety.

TECHNICAL FIELD

Embodiments of the present application relate to the field of encoding and decoding, and in particular, to a polar code decoding method.

BACKGROUND

In a communications system, channel encoding is generally used to improve reliability of data transmission and ensure quality of communication. The Polar code has been proved to be a good code that can achieve a Shannon capacity and has low encoding and decoding complexity. The Polar code is a linear block code. A generator matrix thereof is $G_N$, and an encoding process thereof is $x_1^N = u_1^N G_N$, where $G_N = B_N F^{\otimes n}$, and a code length N=2n, where n≥0. $u_1^N$ is input bits, including information bits and frozen bits. Herein, $$F = \begin{bmatrix} 1 & 0 \\ 1 & 1 \end{bmatrix},$$

and $B_N$ is a transposed matrix, for example, a bit reversal matrix. $F^{\otimes n}$ is a Kronecker power of F, and is defined as $F^{\otimes n} = F \otimes F^{\otimes (n-1)}$. The Polar code may be expressed by using a coset code (N, K, A, $u_{A^C}$), and an encoding process thereof is $x_1^N = u_A G_N(A) \oplus u_{A^C} G_N(A^C)$, where A is a set of indexes of information bits, $G_N(A)$ is a submatrix of $G_N$ and is obtained by using rows that correspond to the indexes in the set A, and $G_N(A^C)$ is a submatrix of $G_N$ and is obtained by using rows that correspond to indexes in the set $A^C$. $u_{A^C}$ is frozen bits, where a quantity of the frozen bits is (N−K) and the frozen bits are known bits. For simplicity, these frozen bits may be set to 0.

The Polar code may also be decoded by means of maximum likelihood (ML), and a maximum likelihood decoder for ML decoding finds an information bit sequence, to minimize a squared Euclidean distance:

$$E_{min} = \min_{u_k} \| y_1^N - z_1^N(u_1, u_2, \ldots, u_N) \|^2$$

where $z_k$ is a symbol obtained after BPSK mapping, where $z_k = (1-2x_k), k=1, \ldots, N$.

Complexity of ML decoding is $O(2^K)$.

It can be seen that, in the prior art, ML decoding for the Polar code has excessively high complexity.

SUMMARY

Embodiments of the present application provide a polar code decoding method and decoding apparatus, so as to reduce decoding complexity.

According to one aspect, a Polar code decoding apparatus is provided, including:

a division module, configured to receive a to-be-decoded Polar code having a length of N, and divide the to-be-decoded Polar code into m subcodes of the Polar code that are coupled to each other, where each subcode of the Polar code has a length of N/m, N and m are integer powers of 2, and N>m;

m independent processing modules, separately configured to calculate, for the m subcodes of the Polar code, squared Euclidean distances of input bits that are independent of each other in the m subcodes of the Polar code, to obtain minimum squared Euclidean distances of the input bits that are independent of each other in the m subcodes of the Polar code, where the minimum squared Euclidean distances of the input bits that are independent of each other in the m subcodes of the Polar code are referred to as independent minimum squared Euclidean distances;

a combined processing module, configured to obtain, according to the m independent minimum squared Euclidean distances, a minimum squared Euclidean distance of input bits that are coupled to each other in the m subcodes of the Polar code, where the minimum squared Euclidean distance of the input bits that are coupled to each other in the subcodes of the Polar code is referred to as a combined minimum squared Euclidean distance; and a result output module, configured to obtain input bits that are in the m subcodes of the Polar code and that meet the independent minimum squared Euclidean distances and the combined minimum squared Euclidean distance, and obtain a decoding result of the to-be-decoded Polar code with reference to relationships between the m subcodes of the Polar code and the to-be-decoded Polar code.

According to another aspect, a decoding method executed by the foregoing apparatus is provided.

According to the embodiments of the present application, a to-be-decoded Polar code is divided, and combined maximum likelihood processing is performed, which reduces decoding complexity and a decoding delay of the Polar code, and improves a throughput rate of an ML decoder for the Polar code.

DESCRIPTION OF EMBODIMENTS

Figure 1:
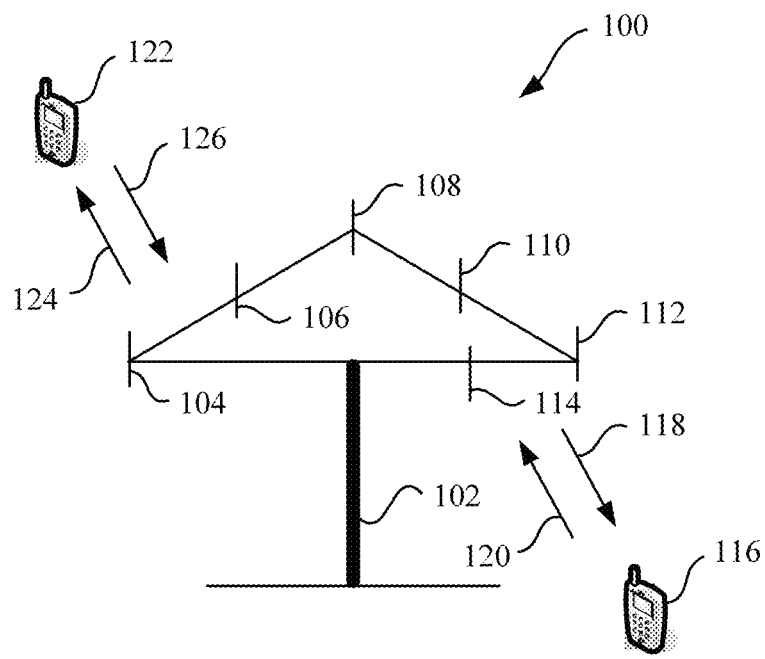
FIG. 1 is a schematic diagram of a wireless communications system in an application environment according to an embodiment of the present application.

The following describes the technical solutions in the embodiments of the present application with reference to the accompanying drawings. Apparently, the described embodiments are some but not all of the embodiments of the present application. All other embodiments obtained by a person of ordinary skill in the art based on the embodiments of the present application without creative efforts shall fall within the protection scope of the present application.

Now, multiple embodiments are described with reference to the accompanying drawings, where a same mark in the accompanying drawings indicates a same component herein. For ease of illustration, the following descriptions provide lots of details, so that one or more embodiments are understood comprehensively. However, obviously, the embodiments may also be implemented without these details. In another example, a well known structure and device are shown in a form of block diagrams, so as to describe one or more embodiments.

The terms such as "component", "module", and "system" in this specification are used to represent an entity, hardware, firmware, combination of hardware and software, software, or software in execution related to a computer. For example, the component may be, but is not limited to, a process running on a processor, a processor, an object, an executable file, a thread of execution, and a program and/or a computer. By means of illustration, both an application running on a computing device and the computing device may be components. One or more components may reside within a process and/or a thread of execution, and the components may be located on one computer and/or distributed between two or more computers. In addition, these components may be executed from various computer-readable storage media having various data structures stored thereon. The components may perform communication by means of a local and/or remote process and according to, for example, a signal having one or more data packets (for example, data from two components interacting with another component in a local system, a distributed system, and/or across a network such as the Internet that interacts with another system by means of a signal).

In addition, an access terminal in each embodiment may also be referred to as a system, a user unit, a user station, a mobile radio station, a mobile station, a remote station, a remote terminal, a mobile device, a user terminal, a terminal, a wireless communications device, a user agent, a user apparatus, or user equipment (UE). The access terminal may be a cellular phone, a cordless telephone set, a session initiation protocol (SIP) phone, a wireless local loop (WLL) station, a personal digital assistant (PDA), a handheld device having a wireless communications function, a computing device, or another processing device connected to a wireless modem. In addition, each embodiment is described with reference to a base station. The base station may be configured to communicate with a mobile device. The base station may be a base transceiver station (BTS) in a global system of mobile communication (GSM) network or a code division multiple access (CDMA) network, or may be a NodeB (NB) in a wideband code division multiple access (WCDMA) system, or may further be an eNB or evolutional Node B (eNodeB) in a long term evolution (LTE) system, a relay site or an access point, or a base station device in a future fifth generation (5G) network.

In addition, all aspects or features of the present application may be implemented as a method, an apparatus, or a product that uses a standard coding and/or engineering technology. The term "product" in this application covers computer programs that can be accessed from any computer-readable device, carrier, or medium. For example, the computer-readable medium may include, but is not limited to, a magnetic memory device (such as a hard disk, a floppy disk, or a magnetic tape), an optical disc such as a compact disk (CD), or a digital versatile disk (DVD), a smartcard, and a flash memory device (such as an erasable programmable read-only memory (EPROM), or a card, stick, or key driver). In addition, the various storage media described herein may represent one or more devices for storing information and/or another machine-readable medium. The term "machine-readable medium" may include, but is not limited to, a radio channel and various other media capable of storing, including, and/or carrying instructions and/or data.

Now, reference may be made to FIG. 1, which is a schematic diagram of a wireless communications system 100 in according to an embodiment of the present application. The system 100 includes a base station 102, where the base station 102 may include multiple antenna groups. For example, one antenna group may include antennas 104 and 106, and another antenna group may include antennas 108 and 110, and an additional group may include antennas 112 and 114. Two antennas are shown in each antenna group. However, for each group, more or less antennas may be used. The base station 102 may additionally include a transmitter chain and a receiver chain. It may be understood by a person of ordinary skill in the art that both the transmitter chain and the receiver chain may include multiple components (such as a processor, a modulator, a multiplexer, a modem, a demultiplexer, or an antenna) related to signal sending and receiving.

The base station 102 may communicate with one or more access terminals (for example, an access terminal 116 and an access terminal 122). However, it may be understood that, the base station 102 may communicate with almost any quantity of access terminals similar to the access terminals 116 and 122. The access terminals 116 and 122 each may be, for example, a cellular phone, a smartphone, a portable computer, a handheld communications device, a handheld computing device, a satellite radio apparatus, a Global Positioning System (GPS) device, a PDA, and/or any other suitable device used for communication on the wireless communications system 100. As shown in the figure, the access terminal 116 communicates with the antennas 112 and 114, where the antennas 112 and 114 send information to the access terminal 116 through a forward link 118 and receive information from the access terminal 116 through a reverse link 120. In addition, the access terminal 122 communicates with the antennas 104 and 106, where the antennas 104 and 106 send information to the access terminal 122 through a forward link 124 and receive information from the access terminal 122 through a reverse link 126. In a frequency division duplex (FDD) system, for example, the forward link 118 may use a frequency band different from that used by the reverse link 120, and the forward link 124 may use a frequency band different from that used by the reverse link 126. In addition, in a time division duplex (TDD) system, the forward link 118 and the reverse link 120 may use a common frequency band, and the forward link 124 and the reverse link 126 may use a common frequency band.

Each group of antennas and/or each area designed for communication is referred to as a sector of the base station 102. For example, an antenna group may be designed to communicate with an access terminal in a sector of a coverage area of the base station 102. In communication by means of the forward links 118 and 124, a transmit antenna of the base station 102 may improve, by means of beamforming, signal-to-noise ratios of the forward links 118 and 124 that correspond to the access terminals 116 and 122. In addition, compared with a situation in which a base station sends information to all access terminals of the base station by using a single antenna, when the base station 102 sends, by means of beamforming, information to the access terminals 116 and 122 that are randomly distributed in a related coverage area, a mobile device in a neighboring cell is less interfered with.

In a given time, the base station 102, the access terminal 116, and/or the access terminal 122 may be a wireless communications sending apparatus, and/or a wireless communications receiving apparatus. When sending data, the wireless communications sending apparatus may encode data and transmit the encoded data. Specifically, the wireless communications sending apparatus may have (for example, generate, acquire, and store in a memory) a particular quantity of information bits that need to be sent to a wireless communications receiving apparatus through a channel. Such information bits may be included in a transmission block (or multiple transmission blocks) of data, where multiple transmission blocks may be generated by means of segmentation. In addition, the wireless communications sending apparatus may encode each transmission block by using a Polar code encoder (which is not shown in FIG. 1). Correspondingly, when receiving the data, the wireless communications receiving apparatus may perform Polar decoding on the data, so as to improve reliability of data communication.

Figure 2:
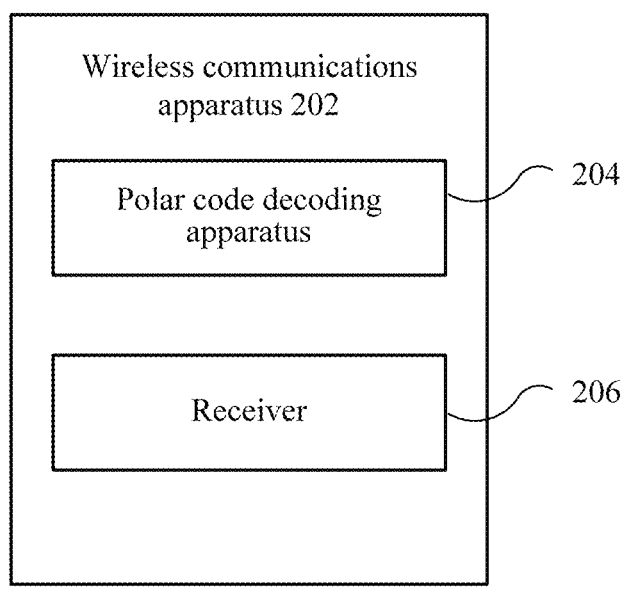
FIG. 2 is a block diagram of a system according to an embodiment of the present application.

FIG. 2 shows a system 200 that performs a polar code decoding method in a wireless communications environment. The system 200 includes a wireless communications apparatus 202. It is shown that the wireless communications apparatus 202 receives data through a receiving channel. Although it is shown that the wireless communications apparatus 202 receives data, the wireless communications apparatus 202 may also send data through a channel. For example, the wireless communications apparatus 202 may send and receive data at the same time, the wireless communications apparatus 202 may send and receive data at different moments, or that the wireless communications apparatus 202 sends and receives data at the same time and that the wireless communications apparatus 202 sends and receives data at different moments are combined. The wireless communications apparatus 202 may be, for example, a base station (such as the base station 102 in FIG. 1), or an access terminal (such as the access terminal 116 in FIG. 1 or the access terminal 122 in FIG. 1).

The wireless communications apparatus 202 may include a Polar code decoder 204 and a receiver 206. The Polar code decoder 204 is configured to divide, according to a feature of a structure of a Polar code that is received by the receiver 206 and that has a length of N, the Polar code into m subcodes of the Polar code that are coupled to each other, where each subcode of the Polar code has a length of N/m, N and m are integer powers of 2, and N>m; first, perform maximum likelihood scale minimizing on input bits that are independent of each other in the m subcodes of the Polar code (that is, for the m subcodes of the Polar code, calculate squared Euclidean distances of input bits that are independent of each other, to obtain minimum squared Euclidean distances of the input bits that are independent of each other in the m subcodes of the Polar code), and then perform maximum likelihood scale minimizing in a combined manner, to obtain a result of maximum likelihood decoding for the Polar code whose original length is N.

Figure 3:
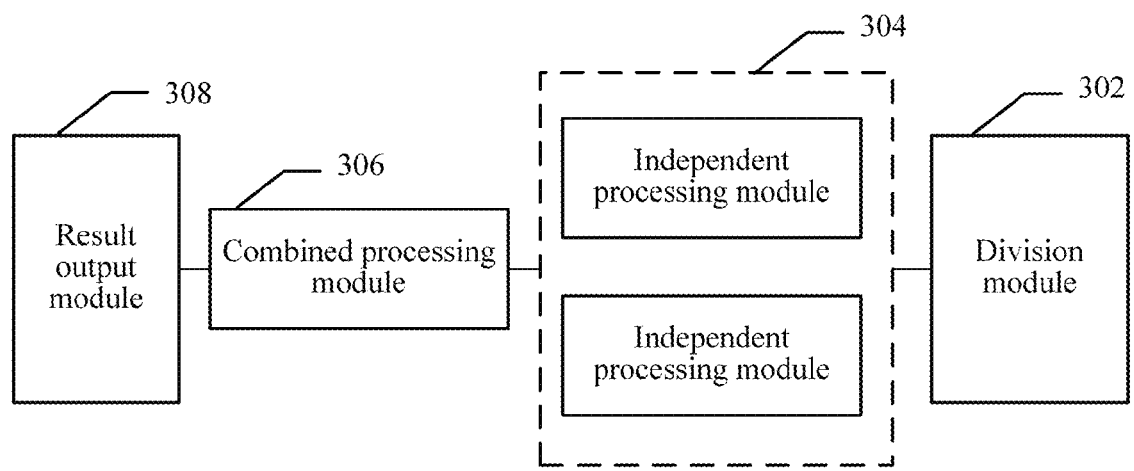
FIG. 3 is a block diagram of a Polar code decoding apparatus according to an embodiment of the present application.

Referring to FIG. 3, which is a block diagram of a Polar code decoding apparatus 300 according to an embodiment of the present application, the Polar code decoding apparatus includes:

a division module 302, configured to receive a to-be-decoded Polar code having a length of N, and divide the to-be-decoded Polar code into m subcodes of the Polar code that are coupled to each other, where each subcode of the Polar code has a length of N/m, N and m are integer powers of 2, and N>m;

m independent processing modules 304, separately configured to calculate, for the m subcodes of the Polar code, squared Euclidean distances of input bits that are independent of each other in the m subcodes of the Polar code, to obtain minimum squared Euclidean distances of the input bits that are independent of each other in the m subcodes of the Polar code, where the minimum squared Euclidean distances of the input bits that are independent of each other in the m subcodes of the Polar code are referred to as independent minimum squared Euclidean distances;

a combined processing module 306, configured to obtain, according to the m independent minimum squared Euclidean distances, a minimum squared Euclidean distance of input bits that are coupled to each other in the m subcodes of the Polar code, where the minimum squared Euclidean distance of the input bits that are coupled to each other in the m subcodes of the Polar code is referred to as a combined minimum squared Euclidean distance; and a result output module 308, configured to obtain input bits that are in the m subcodes of the Polar code and that meet the independent minimum squared Euclidean distances and the combined minimum squared Euclidean distance, and obtain a decoding result of the to-be-decoded Polar code with reference to relationships between the m subcodes of the Polar code and the to-be-decoded Polar code.

In a preferred example, the independent processing modules perform the processing in parallel. m may be 2, 4, 8, or the like. In the following implementation manners, examples in which m is 2 and 4 are used, but it is not limited that in other implementation manners, the polar code is divided into other quantities of modules according to the solution of the present application. Obviously, in the foregoing implementation manner, decoding complexity of a Polar code can be reduced by means of division and combined processing.

Figure 4:
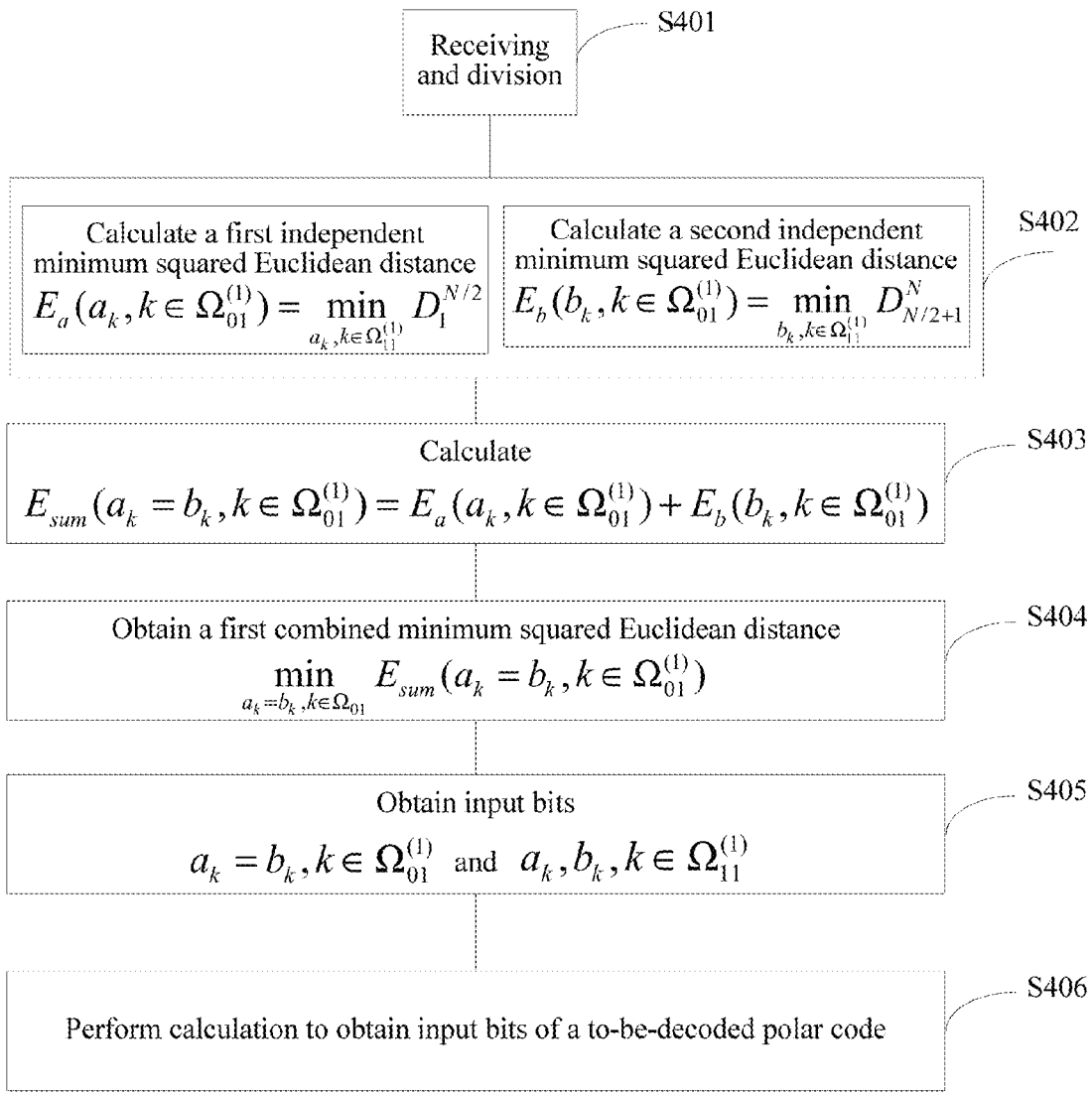
FIG. 4 is a flow diagram of a Polar code decoding method according to an embodiment of the present application.

Referring to FIG. 4, which is a flow diagram of a decoding method according to another embodiment of the present application, an example is used, in which m in the implementation manner of FIG. 3 is equal to 2 and a parallel decoding manner is used. In this specific implementation manner, a decoding process is basically completed in two stages. The decoding apparatus is referred to as a two-stage parallel decoder 400 (also known as Two-Stage Search Decoder).

In the foregoing implementation manner shown in FIG. 4, generally, ML decoding for the Polar code may be completed in two stages, greatly reducing the complexity of ML decoding for the Polar code. Pseudocode of the foregoing two-stage parallel decoder (or known as Two-Stage Search ML Decoder) is briefly expressed as follows:

| Two-Stage Search ML Decoder |
| --- |
| For (any realization of $a_k = b_k$, $k \in \Omega_{01}^{(1)}$) |
| { |
|   Exhaustive search |
|   Exhaustive search $E_b(b_k, k \in \Omega_{01}^{(1)}) = \min_{b_k, k \in \Omega_{11}^{(1)}} D_{N/2+1}^N$ |
|   Combine $E_{sum}(a_k = b_k, k \in \Omega_{01}^{(1)}) = E_a(a_k, k \in \Omega_{01}^{(1)}) + E_b(b_k, k \in \Omega_{01}^{(1)})$ |
| } |
| Exhaustive search $\min_{a_k = b_k, k \in \Omega_{01}^{(1)}} E_{sum}(a_k = b_k, k \in \Omega_{01}^{(1)})$ |

First, for ease of description, in the processes and accompanying drawings of the implementation manners, a to-be-decoded Polar code is expressed by using a formula $$x_1^N = v_1^N \times \begin{bmatrix} F^{\otimes(n-1)} & 0 \\ F^{\otimes(n-1)} & F^{\otimes(n-1)} \end{bmatrix} = \begin{bmatrix} (v_1^{N/2} \oplus v_{N/2+1}^N) F^{\otimes(n-1)} & v_{N/2+1}^N F^{\otimes(n-1)} \end{bmatrix};$$

an index set $\Omega_{01}^{(1)}$ represents that $v_k$ is a frozen bit and $v_{k+N/2}$ is an information bit; and an index set $\Omega_{11}^{(1)}$ represents that $v_k$ is an information bit and $v_{k+N/2}$ is an information bit. In other words, if $k \in \Omega_{01}^{(1)}$, $a_k$ and $b_k$ are coupled to each other, which is expressed by using a formula $a_k = b_k$; and if $k \in \Omega_{11}^{(1)}$, $a_k, b_k$ are independent of each other. It should be noted that, for the Polar code, there is no index set $\Omega_{10}^{(1)}$, that is, $v_k$ is an information bit and $v_{k+N/2}$ is a frozen bit. In some examples, the foregoing $\Omega_{11}^{(1)}$ may be divided into three subsets: $\Omega_{11}^{(1)} = \{\Omega_{01}^{(2)} + N/4\} \cup \Omega_{11}^{(2)} \cup \{\Omega_{11}^{(2)} + N/4\}$, where an index set $\Omega_{01}^{(2)}$ represents all indexes meeting $k \notin \Omega_{11}^{(1)}$ and $k + N/4 \in \Omega_{11}^{(1)}$, where $1 \leq k \leq N/4$, and an index set $\Omega_{11}^{(2)}$ represents all indexes meeting $k \in \Omega_{11}^{(1)}$ and $k + N/4 \in \Omega_{11}^{(1)}$, where $1 \leq k \leq N/4$. Similarly, there is no index meeting the following conditions: $k \in \Omega_{11}^{(1)}$ and $k + N/4 \notin \Omega_{11}^{(1)}$, where $1 \leq k \leq N/4$.

With reference to a working principle of maximum likelihood decoding, referring to FIG. 4, a working process of a decoding implementation manner shown in FIG. 4 includes:

S401: Receive a to-be-decoded Polar code having a length of N, where the to-be-decoded Polar code is expressed by using a formula $$x_1^N = v_1^N \times \begin{bmatrix} F^{\otimes(n-1)} & 0 \\ F^{\otimes(n-1)} & F^{\otimes(n-1)} \end{bmatrix} = \begin{bmatrix} (v_1^{N/2} \oplus v_{N/2+1}^N) F^{\otimes(n-1)} & v_{N/2+1}^N F^{\otimes(n-1)} \end{bmatrix},$$

and divide the to-be-decoded Polar code into two subcodes of the Polar code: a first subcode of the Polar code and a second subcode of the Polar code, where input bits corresponding to the two subcodes of the Polar code are $a_k$ and $b_k$ respectively, and are separately expressed by using formulas $a_1^{N/2} = v_1^{N/2} \oplus v_{N/2+1}^N$ and $b_1^{N/2} = v_{N/2+1}^N$.

S402: For an input bit $a_k, k \in \Omega_{11}^{(1)}$ that is in the first subcode of the Polar code and that is independent of any input bit in the second subcode of the Polar code, perform calculation to obtain a first independent minimum squared Euclidean distance $$E_a(a_k, k \in \Omega_{01}^{(1)}) = \min_{a_k, k \in \Omega_{11}^{(1)}} D_1^{N/2};$$

and for an input bit $b_k, k \in \Omega_{11}^{(1)}$ that is in the second subcode of the Polar code and that is independent of any input bit in the first subcode of the Polar code, perform calculation to obtain a second independent minimum squared Euclidean distance $$E_b(b_k, k \in \Omega_{01}^{(1)}) = \min_{b_k, k \in \Omega_{11}^{(1)}} D_{N/2+1}^N.$$

S403: Combine the first independent minimum squared Euclidean distance and the second independent minimum squared Euclidean distance $E_a, E_b$, to obtain $E_{sum}$ that is expressed by using a formula $E_{sum}(a_k = b_k, k \in \Omega_{01}^{(1)}) = E_a(a_k, k \in \Omega_{01}^{(1)}) + E_b(b_k, k \in \Omega_{01}^{(1)})$.

S404: Perform search to obtain a first combined minimum squared Euclidean distance that is expressed by using a formula $$\min_{a_k = b_k, k \in \Omega_{01}^{(1)}} E_{sum}(a_k = b_k, k \in \Omega_{01}^{(1)}),$$

that is, $$\min_{a_k = b_k, k \in \Omega_{01}} E_{sum}(a_k = b_k, k \in \Omega_{01}^{(1)}).$$

S405: Obtain input bits $a_k = b_k, k \in \Omega_{01}^{(1)}$ that are coupled to each other in the first subcode of the Polar code and the second subcode of the Polar code and that meet the first combined minimum squared Euclidean distance; and obtain input bits $a_k, b_k, k \in \Omega_{11}^{(1)}$ that are independent of each other in the first subcode of the Polar code and the second subcode of the Polar code and that meet the first independent minimum squared Euclidean distance $E_a$ and the second independent minimum squared Euclidean distance $E_b$ (that is, perform search to obtain input bits $a_k, b_k, k \in \Omega_{11}^{(1)}$ that minimize $E_a$ or $E_b$).

S406: After all $a_k, b_k$ are obtained through calculation, perform calculation according to relationships $b_1^{N/2} = v_{N/2+1}^N$ and $a_1^{N/2} = v_1^{N/2} \oplus v_{N/2+1}^N$ between the two subcodes of the Polar code and the to-be-decoded Polar code, to obtain input bits $v_1^{N/2}$ and $v_{N/2+1}^N$ of the to-be-decoded Polar code.

Figure 5:
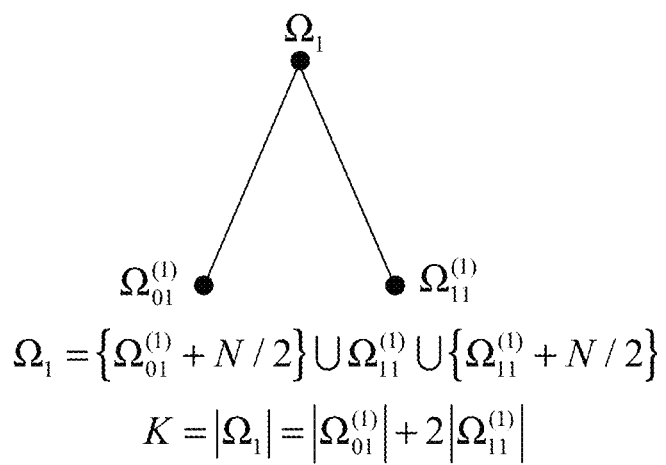
FIG. 5 is a exploded flow diagram of a two-stage parallel decoding according to the embodiment of the present application as shown in FIG. 4.

Reference may be made to FIG. 5, which is a exploded flow diagram of a two-stage parallel decoding in the foregoing implementation manner. It can be learned from the schematic diagram that, by means of parallel decoding, complexity is desirably reduced.

Figure 6:
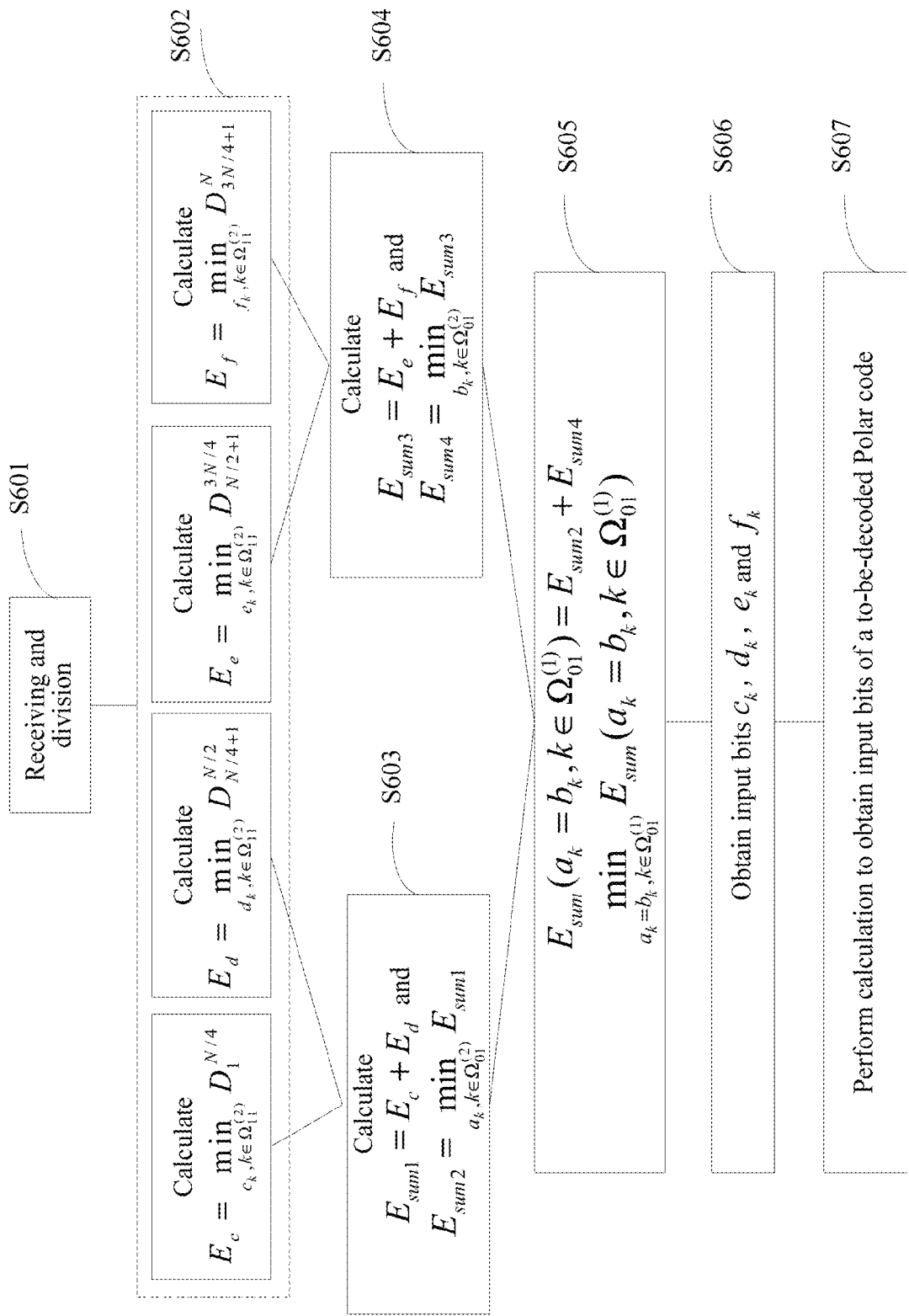
FIG. 6 is a flow diagram of a Polar code decoding method according to another embodiment of the present application.

Reference may be made to FIG. 6, which is a flow diagram of a decoding method according to another embodiment of the present application. This specific implementation manner is further developed based on the foregoing parallel decoding solution, to implement a decoding solution in which m in the implementation manner shown in FIG. 3 is equal to 4. This decoding solution is briefly referred to as three-stage parallel ML decoding. With reference to a working principle of maximum likelihood decoding, referring to FIG. 6, a working process of the foregoing implementation manner includes:

S601: Receive a to-be-decoded Polar code having a length of N, and divide the to-be-decoded Polar code into four subcodes of the Polar code that are coupled to each other, where each subcode of the Polar code has a length of N/4, N and m are integer powers of 2, and N>4.

Specifically, the to-be-decoded Polar code is expressed by using a formula $$x_1^N = v_1^N \times \begin{bmatrix} F^{\otimes(n-1)} & 0 \\ F^{\otimes(n-1)} & F^{\otimes(n-1)} \end{bmatrix} = \begin{bmatrix} (v_1^{N/2} \oplus v_{N/2+1}^N)F^{\otimes(n-1)} & v_{N/2+1}^N F^{\otimes(n-1)} \end{bmatrix},$$

and the four subcodes of the Polar code are subsequently referred to as a third subcode of the Polar code, a fourth subcode of the Polar code, a fifth subcode of the Polar code, and a sixth subcode of the Polar code. A specific division method thereof may be as follows: first, the to-be-decoded Polar code is divided, by using the method in S401 in FIG. 4, into two subcodes of the Polar code, that is, a first subcode of the Polar code and a second subcode of the Polar code, where input bits corresponding to the two subcodes of the polar code are $a_k$ and $b_k$ respectively, and are separately expressed by using formulas $a_1^{N/2}=v_1^{N/2}\oplus v_{N/2+1}^N$ and $b_1^{N/2}=v_{N/2+1}^N$; and then, the first subcode of the Polar code is divided into a third subcode of the Polar code and a fourth subcode of the Polar code, and the second subcode of the Polar code is divided into a fifth subcode of the Polar code and a sixth subcode of the Polar code.

Input bits of the foregoing third subcode of the Polar code, fourth subcode of the Polar code, fifth subcode of the Polar code, and sixth subcode of the Polar code are $c_k$ that is expressed by using a formula $c_k=a_k\oplus a_{k+N/4}$, $d_k$ that is expressed by using a formula $d_k=a_{k+N/4}$, $e_k$ that is expressed by using a formula $e_k=b_k\oplus b_{k+N/4}$, and $f_k$ respectively, where $f_k=b_{k+N/4}$, $1\leq k\leq N/4$, $a_1^{N/2}=v_1^{N/2}\oplus v_{N/2+1}^N$, and $b_1^{N/2}=v_{N/2+1}^N$.

A specific principle of the foregoing division solution is as follows:

$x_1^{N/2}=a_1^{N/2}F^{\otimes(n-1)}$ can be further divided into:

$x_1^{N/2}=[c_1^{N/4} F^{\otimes(n-2)} \; d_1^{N/4} F^{\otimes(n-2)}]$

Similarly, it can be obtained that:

$x_1^N=[c_1^{N/4} F^{\otimes(n-2)} \; d_1^{N/4} F^{\otimes(n-2)} \; e_1^{N/4} F^{\otimes(n-2)} \; f_1^{N/4} F^{\otimes(n-2)}]$;

and according to a structure of the Polar code shown in the foregoing formula, obviously, the foregoing division method can be performed smoothly.

S602: For input bits that are independent of each other in the foregoing four subcodes of the Polar code, separately calculate the independent minimum squared Euclidean distances, to obtain a first independent minimum squared Euclidean distance $$E_c = \min_{c_k, k \in \Omega_{11}^{(2)}} D_1^{N/4},$$

a second independent minimum squared Euclidean distance $$E_d = \min_{d_k, k \in \Omega_{11}^{(2)}} D_{N/4+1}^{N/2},$$

a third independent minimum squared Euclidean distance $$E_e = \min_{e_k, k \in \Omega_{11}^{(2)}} D_{N/2+1}^{3N/4},$$

and a fourth independent minimum squared Euclidean distance $$E_f = \min_{f_k, k \in \Omega_{11}^{(2)}} D_{3N/4+1}^{N},$$

where an index set $\Omega_{11}^{(2)}$ represents all indexes meeting $k\in\Omega_{11}^{(1)}$ and $k+N/4\in\Omega_{11}^{(1)}$, and an index set $\Omega_{11}^{(1)}$ represents that $v_k$ is an information bit and $v_{k+N/2}$ is an information bit, where $1\leq k\leq N/4$.

S603: Perform calculation to obtain a sum of squared Euclidean distances of the third subcode of the Polar code and the fourth subcode of the Polar code, where the sum is expressed by using a formula $E_{sum1}=E_c+E_d$, and for input bits that are coupled to each other in the third subcode of the Polar code and the fourth subcode of the Polar code, perform search to obtain a first combined minimum squared Euclidean distance that is expressed by using a formula $$E_{sum2} = \min_{a_k, k \in \Omega_{01}^{(2)}} E_{sum1},$$

where $\Omega_{01}^{(2)}$ represents all indexes meeting $k \notin \Omega_{11}^{(1)}$ and $k+N/4\in\Omega_{11}^{(1)}$, where $1\leq k\leq N/4$.

S604: Perform calculation to obtain a sum of squared Euclidean distances of the fifth subcode of the Polar code and the sixth subcode of the Polar code, where the sum is expressed by using a formula $E_{sum3}=E_e+E_f$, and for input bits that are coupled to each other in the fifth subcode of the Polar code and the sixth subcode of the Polar code, perform search to obtain a second combined minimum squared Euclidean distance that is expressed by using a formula $$E_{sum4} = \min_{b_k, k \in \Omega_{01}^{(2)}} E_{sum3},$$

where $\Omega_{01}^{(2)}$ represents all indexes meeting $k \notin \Omega_{11}^{(1)}$ and $k+N/4\in\Omega_{11}^{(1)}$, where $1\leq k\leq N/4$.

S605: For input bits that are coupled to each other in all the subcodes of the Polar code, calculate a total squared Euclidean distance that is expressed by using a formula $E_{sum}(a_k=b_k, k\in\Omega_{01}^{(1)})=E_{sum2}+E_{sum4}$, and perform search to obtain a third combined minimum squared Euclidean distance $$\min_{a_k=b_k, k \in \Omega_{01}^{(1)}} E_{sum}(a_k = b_k, k \in \Omega_{01}^{(1)}),$$

where an index set $\Omega_{01}^{(1)}$ represents that $v_k$ is a frozen bit, and $v_{k+N/2}$ is an information bit.

S606: Obtain input bits $a_k=b_k, k\in\Omega_{01}^{(1)}$ meeting the third combined minimum squared Euclidean distance $$\min_{a_k=b_k, k \in \Omega_{01}^{(1)}} E_{sum}(a_k = b_k, k \in \Omega_{01}^{(1)}),$$

and separately substitute the input bits $a_k=b_k, k\in\Omega_{01}^{(1)}$ into the first combined minimum squared Euclidean distance $E_{sum2}$ and the second combined minimum squared Euclidean distance $E_{sum4}$ to obtain other input bits.

S607: After all input bits $c_k$, $d_k$, $e_k$, and $f_k$ are obtained, obtain input bits $v_1^N$ of the to-be-decoded Polar code according to relationships $$\begin{cases} v_k = c_k \oplus d_k \oplus e_k \oplus f_k \\ v_{k+N/4} = d_k \oplus f_k \\ v_{k+N/2} = e_k \oplus f_k \\ v_{k+3N/4} = f_k \end{cases}$$

between the four subcodes of the Polar code and the to-be-decoded Polar code.

In the foregoing implementation manner shown in FIG. 6, generally, ML decoding for the Polar code can be completed in three stages, greatly reducing complexity of ML decoding for the Polar code. Code of the foregoing three-stage parallel decoder (i.e. Three-Stage Search ML Decoder) is briefly expressed as follows:

---

Three-Stage Search ML Decoder

For (any realization of $a_k = b_k, k \in \Omega_{01}^{(1)}$ )
{
    For (any realization of $a_k, k \in \Omega_{01}^{(2)} + N/4$ )
    {
        Calculate $c_k = a_k \oplus a_{k+N/4}$, and $d_k = a_{k+N/4}$,
        where $1 \leq k \leq N/4$, $k \notin \Omega_{11}^{(2)}$ Search $E_c = \min_{c_k, k \in \Omega_{11}^{(2)}} D_1^{N/4}$ Search $E_d = \min_{d_k, k \in \Omega_{11}^{(2)}} D_{N/4+1}^{N/2}$ Combine $E_{sum\,1} = E_c + E_d$
    }

Search $E_{sum2} = \min_{a_k, k \in \Omega_{01}^{(2)}} E_{sum1}$

For (any realization of $b_k, k \in \Omega_{01}^{(2)} + N/4$ )
    {
        Calculate $e_k = b_k \oplus b_{k+N/4}$, and $f_k = b_{k+N/4}$,
        where $1 \leq k \leq N/4$, $k \notin \Omega_{11}^{(2)}$ Search $E_e = \min_{e_k, k \in \Omega_{11}^{(2)}} D_{N/2+1}^{3N/4}$ Search $E_f = \min_{f_k, k \in \Omega_{11}^{(2)}} D_{3N/4+1}^{N}$ Combine $E_{sum3} = E_e + E_f$
    }

Search $E_{sum4} = \min_{b_k, k \in \Omega_{01}^{(2)}} E_{sum3}$

Combine $E_{sum}(a_k = b_k, k \in \Omega_{01}^{(1)}) = E_{sum2} + E_{sum4}$
}

Exhaustive search $\min_{a_k = b_k, k \in \Omega_{01}^{(1)}} E_{sum}(a_k = b_k, k \in \Omega_{01}^{(1)})$

---

A technical effect of this implementation manner is described in detail below, where the complexity of the foregoing three-stage parallel maximum likelihood decoding is $2|\Omega_{01}^{(1)}| - |\Omega_{11}^{(1)}| + |\Omega_{11}^{(2)}|$. Referring to Table 1 below, which is a comparison between the complexity of the foregoing three-stage parallel maximum likelihood decoding and the complexity of original maximum likelihood decoding in cases of different code lengths N, where Comp 1 is the complexity of three-stage parallel ML and Comp 2 is the complexity of original ML.

TABLE 1

| N | $|\Omega_{01}^{(1)}|$ | $|\Omega_{11}^{(1)}|$ | $|\Omega_{11}^{(2)}|$ | Comp 1 | Comp 2 |
|---|---|---|---|---|---|
| 32 | 4 | 2 | 2 | $2^8$ | $2^{16}$ |
| 64 | 4 | 4 | 5 | $2^{13}$ | $2^{32}$ |
| 128 | 8 | 6 | 11 | $2^{25}$ | $2^{64}$ |
| 256 | 16 | 10 | 23 | $2^{49}$ | $2^{128}$ |

Figure 7:
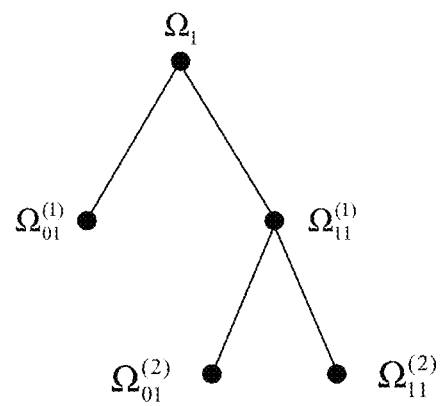
FIG. 7 is a exploded diagram of a three-stage parallel decoding according to the embodiment of the present application as shown in FIG. 6.

Reference may be made to FIG. 7, which is a exploded diagram of the foregoing three-stage parallel decoding. It can be seen from FIG. 7 that, the complexity of maximum likelihood decoding in this implementation manner of the present application can be greatly reduced.

In the foregoing implementation manners, m is 2 or 4. A person skilled in the art may know that m may also be 8, or another integer power of 2. In the foregoing implementation manners, by reducing decoding complexity, and especially, by using a parallel decoding manner, a decoding throughput can be greatly improved and a decoding delay can be decreased.

The ML decoding method described in each implementation manner of the present application may be used in combination with any decoding method that does not logically conflict with the ML decoding method, which is not limited in the implementation manners of the present application.

As an example, another specific implementation manner of the present application provides a decoding method. In the method, first, successive cancellation (SC) decoding is performed independently (preferably, in parallel) on m subcodes of a Polar code, and then, combined processing of maximum likelihood ML is performed on the subcodes of the Polar code, that is, complete Polar code decoding is performed by combining SC parallel decoding and the foregoing parallel ML decoding method (for example, the two-stage parallel ML decoding method or the three-stage parallel ML decoding method).

The Polar code decoding apparatus shown in FIG. 3 is used as an example. Optionally, the apparatus further includes an SC independent decoding module, configured to divide a Polar code having a length of S into N subcodes of the Polar code, where each subcode has a length of S/N, and separately perform SC decoding to obtain N SC decoding results (for example, likelihood ratios), where S and N are integer powers of 2 and S>N, so that the division module, the m independent processing modules, the combined processing module, and the result output module according to any one of the foregoing implementation manners complete corresponding work by using all input bits in the N SC decoding results as the to-be-decoded Polar code having the length of N; and obtain, according to all of the input bits, a decoding result of the Polar code having the length of S.

Figure 8:
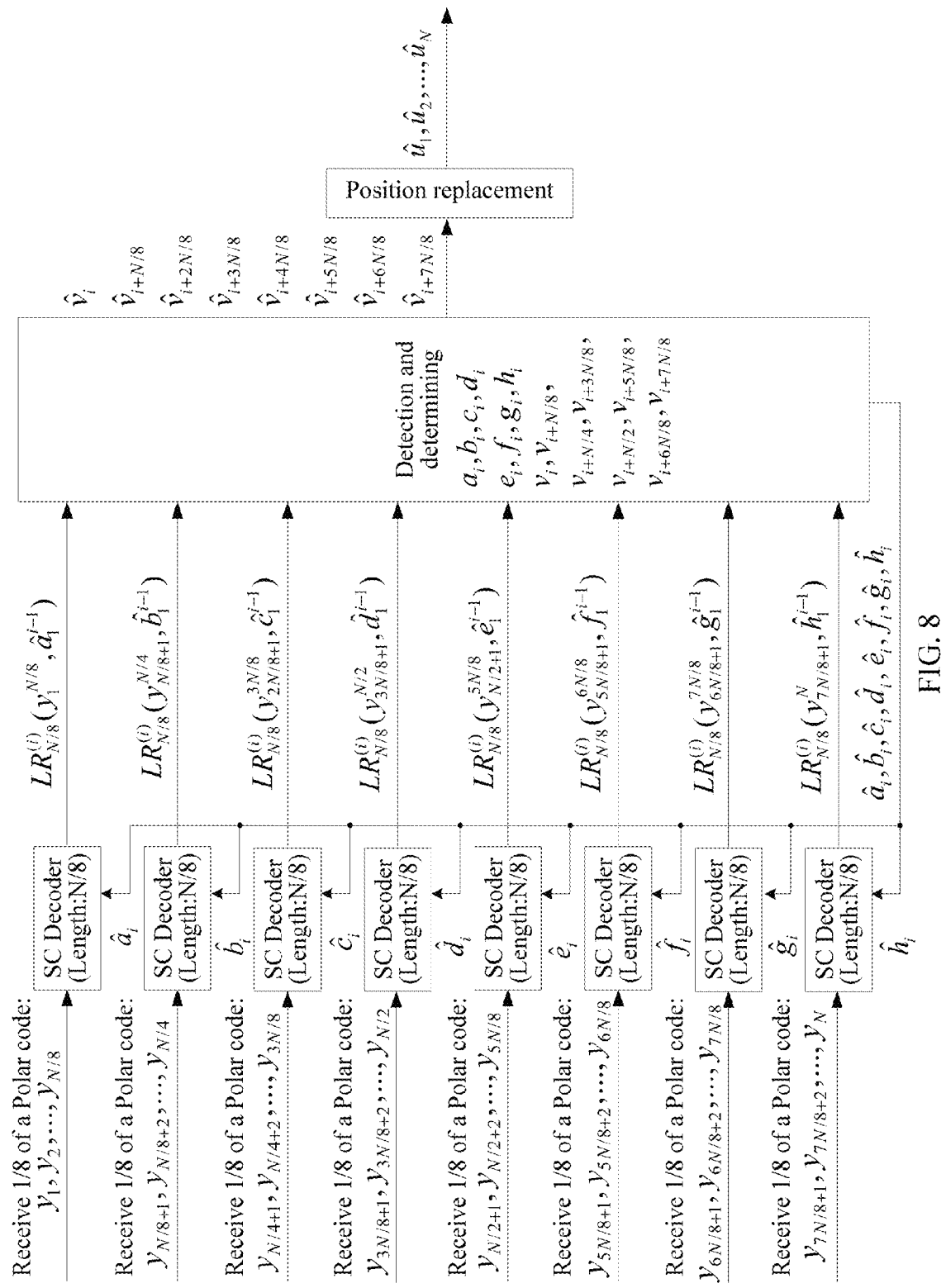
FIG. 8 is a flow diagram of a decoding method according to yet another embodiment of the present application.

In a more specific example, in the Chinese Patent Application No. 201310073607.8, content of which is incorporated herein by reference, an implementation manner in which SC decoding can be performed in parallel on eight subcodes of a code is provided (reference may be made to FIG. 4 in Chinese Patent Application No. 201310073607.8). Compared with the implementation manner in the Chinese Patent Application No. 201310073607.8, in this example, after the SC parallel decoding, it is no longer necessary to traverse $(a_i, b_i, c_i, d_i, e_i, f_i, g_i, h_i)$ to make a decision. Instead, an ML principle is used to perform combined decoding. Referring to FIG. 8, a process thereof includes:

First, a Polar code having a length of S is divided into eight Polar codes having a length of S/8, that is, eight received signal vectors $y_1^{S/8}$, $y_{S/8-1}^{2S/8}$, $y_{2S/8+1}^{3S/8}$, ..., and $y_{7S/8-1}^{S}$. Corresponding input bits meet:

$$\begin{cases} a_i = v_i \oplus v_{i+S/8} \oplus v_{i+2S/8} \oplus v_{i+3S/8} \oplus v_{i+4S/8} \oplus v_{i+5S/8} \oplus v_{i+6S/8} \oplus v_{i+7S/8} \\ b_i = v_{i+S/8} \oplus v_{i+3S/8} \oplus v_{i+5S/8} \oplus v_{i+7S/8} \\ c_i = v_{i+2S/8} \oplus v_{i+3S/8} \oplus v_{i+6S/8} \oplus v_{i+7S/8} \\ d_i = v_{i+3S/8} \oplus v_{i+7S/8} \\ e_i = v_{i+4S/8} \oplus v_{i+5S/8} \oplus v_{i+6S/8} \oplus v_{i+7S/8} \\ f_i = v_{i+5S/8} \oplus v_{i+7S/8} \\ g_i = v_{i+6S/8} \oplus v_{i+7S/8} \\ h_i = v_{i+7S/8} \end{cases}$$

$$1 \le i \le S/8$$

Eight component decoders (SC decoders having a length of S/8) separately use $y_1^{S/8}$, $y_{S/8+1}^{2S/8}$, $y_{2S/8+1}^{3S/8}$, ..., and $y_{2S/8+1}^{3S/8}$ as inputs. The eight component decoders independently calculate log-likelihood ratios separately:

$$L(a_i) = L_{S/8}^{(i)}(y_1^{S/8}, \hat{a}_1^{i-1}),$$

$$L(b_i) = L_{S/8}^{(i)}(y_{S/8+1}^{2S/8}, \hat{b}_1^{i-1}),$$

$$L(c_i) = L_{S/4}^{(i)}(y_{2S/8+1}^{3S/8}, \hat{c}_1^{i-1}),$$

..., and $$L(h_i) = L_{S/8}^{(i)}(y_{7S/8+1}^{S}, \hat{h}_1^{i-1}).$$

Second, according to the foregoing log-likelihood ratios obtained by means of calculation, ML parallel decoding is performed on the input bits $(v_k, v_{k+S/8}, v_{k+2S/8}, \ldots, v_{k+7S/8})$, which is specifically expressed by using the following formula:

$$\begin{bmatrix} a_k \\ b_k \\ c_k \\ d_k \\ e_k \\ f_k \\ g_k \\ h_k \end{bmatrix} = \begin{bmatrix} v_k \\ v_{k+S/8} \\ v_{k+2S/8} \\ v_{k+3S/8} \\ v_{k+4S/8} \\ v_{k+5S/8} \\ v_{k+6S/8} \\ v_{k+7S/8} \end{bmatrix}^T \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

The matrix on the right of the foregoing formula is actually a generator matrix of a Polar code having a length of N=8. Therefore, in the foregoing decoding process, the ML parallel decoding method for the Polar code in the foregoing implementation manner may be used.

Specifically, $$Y = [L(a_i) = L_{S/8}^{(i)}(y_1^{S/8}, \hat{a}_1^{i-1}),$$

$$L(b_i) = L_{S/8}^{(i)}(y_{S/8+1}^{2S/8}, \hat{b}_1^{i-1}),$$

$$L(c_i) = L_{S/4}^{(i)}(y_{2S/8+1}^{3S/8}, \hat{c}_1^{i-1}),$$

..., $$L(h_i) = L_{S/8}^{(i)}(y_{7S/8+1}^{S}, \hat{h}_1^{i-1})],$$

input bits are $(v_k, v_{k+S/8}, v_{k+2S/8}, \ldots, v_{k+7S/8})$, and after $\hat{v}_i$, $\hat{v}_{i+S/8}$, $\hat{v}_{i+2S/8}$, ..., $\hat{v}_{i+7S/8}$ (i=1, 2, ..., S/8) are obtained, a decoding result $u_1^N$ of the original Polar code may be obtained by position replacement.

In the foregoing implementation manner, a Polar code having a length of S is divided into eight Polar codes having a length of S/8, SC decoding is separately performed on the eight polar codes, and then, an ML combined decoding manner such as two-stage parallel ML decoding or three-stage parallel ML decoding provided in the implementation manners of the present application is used, thereby further reducing decoding complexity and improving a decoding throughput.

It may be understood that, the embodiments described in this specification may be implemented by using hardware, software, firmware, middleware, microcode, or a combination thereof. For implementation by using hardware, a processing unit may be implemented in one or more application specific integrated circuits (ASICs), digital signal processing (DSP) devices, programmable logic devices (PLDs), field-programmable gate arrays (FPGAs), processors, controllers, micro-controllers, microprocessors, or other electronic units configured to perform the functions of this application, or a combination thereof.

When the embodiments are implemented in software, firmware, middleware or microcode, program code or code segments, they can be stored in a machine-readable medium such as a storage component. A code segment may represent a procedure, a function, a subprogram, a program, a routine, a subroutine, a module, a software group, a class, or any combination of instructions, data structures, or program statements. A code segment may be coupled to another code segment or a hardware circuit by passing and/or receiving information, data, arguments, parameters, or memory content. Information, arguments, parameters, data, and the like may be passed, forwarded, or transmitted using any suitable means including memory sharing, message passing, token passing, network transmission, and the like.

For implementation by using software, the technology described in this specification may be implemented by using the modules (for example, procedures and functions) that perform the functions described in this specification. Software code may be stored in a memory unit and performed by a processor. The memory unit may be implemented in the processor or outside the processor. In the latter case, the memory unit may be communicatively coupled to the processor by various means known in the art.

Figure 9:
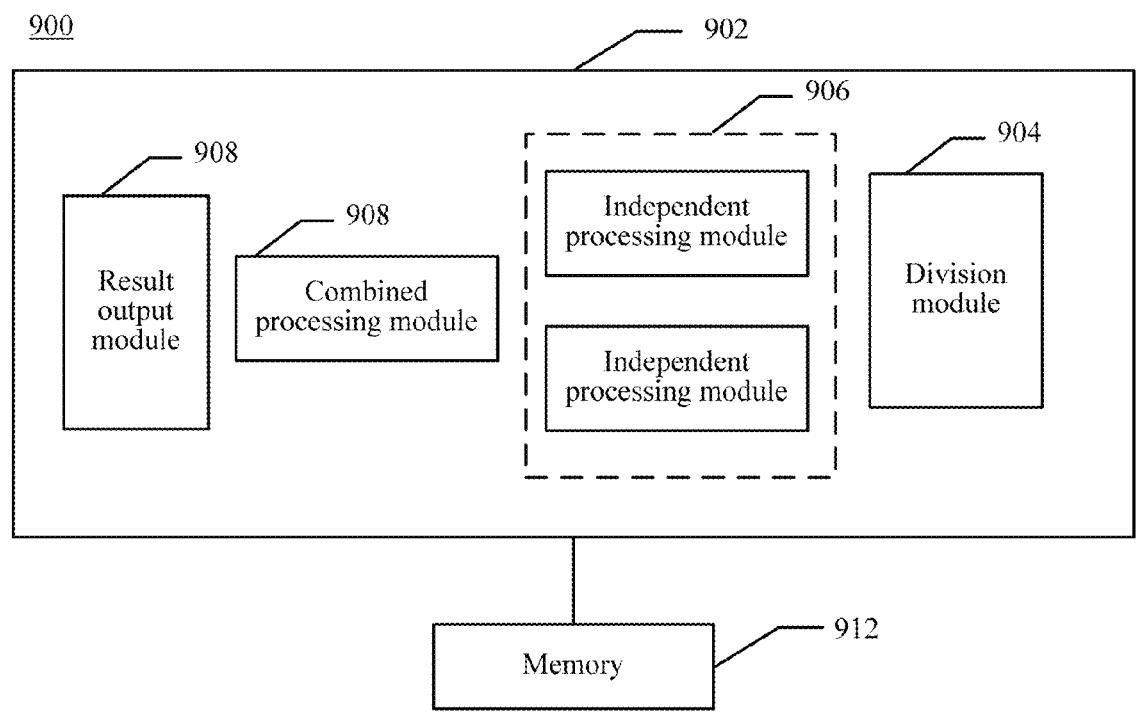
FIG. 9 is a block diagram of a decoding apparatus according to an embodiment of the present application.

Referring to FIG. 9, which shows a system 900 that can use a polar code processing method in a wireless communications environment. For example, the system 900 may at least partially reside in a base station or an access terminal. It should be understood that, the system 900 may be represented as including function blocks, which may be function blocks whose functions are implemented by a processor, software, or a combination thereof (for example, firmware). The system 900 includes a logic group 902 having electronic components that are operated in a combined manner.

For example, the logic group 902 may include: a division module 904, configured to receive a to-be-decoded Polar code having a length of N, and divide the to-be-decoded Polar code into m subcodes of the Polar code that are coupled to each other, where each subcode of the Polar code has a length of N/m, N and m are integer powers of 2, and N>m;

m independent processing modules 906, not all shown in the figure, separately configured to calculate, for the m subcodes of the Polar code, squared Euclidean distances of input bits that are independent of each other in the m subcodes of the Polar code, to obtain minimum squared Euclidean distances of the input bits that are independent of each other in the m subcodes of the Polar code, where the minimum squared Euclidean distances of the input bits that are independent of each other in the m subcodes of the Polar code are referred to as independent minimum squared Euclidean distances;

a combined processing module 908, configured to obtain, according to the m independent minimum squared Euclidean distances, a minimum squared Euclidean distance of input bits that are coupled to each other in the m subcodes of the Polar code, where the minimum squared Euclidean distance of the input bits that are coupled to each other in the m subcodes of the Polar code is referred to as a combined minimum squared Euclidean distance; and a result output module 910, configured to obtain input bits that are in the m subcodes of the Polar code and that meet the independent minimum squared Euclidean distances and the combined minimum squared Euclidean distance, and obtain a decoding result of the to-be-decoded Polar code with reference to relationships between the m subcodes of the Polar code and the to-be-decoded Polar code.

In addition, the system 900 may include a memory 912, where the memory 912 stores instructions used for performing functions related to the electronic components 904, 906, 908, and 910. Although it is shown that the electronic components 904, 906, 908, and 910 are located outside the memory 912, it can be understood that, one or more of the electronic components 904, 906, 908, and 910 may be located in the memory 912. Correspondingly, the implementation manners of the foregoing methods may further be preferably used on the foregoing components. Details thereof are not described herein again.

The above descriptions include examples of one or more embodiments. Certainly, it is impossible to describe, for the descriptions of these embodiments, all possible combinations of the components or methods. However, a person of ordinary skill in the art should be aware that these embodiments may further be combined and transformed. Therefore, the embodiments described in this application are intended to cover all alterations, modifications, and variations falling within the spirit and protection scope of the appended claims. Furthermore, to the extent that the term "include", "have", or the like is used in the description or the claims, such term is intended to be inclusive in a manner similar to the term "comprise" as "comprise" is interpreted when employed as a transitional word in a claim.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the shown or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts shown as units may or may not be physical units, may be located in one position, or may be distributed on a plurality of network units. Some or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present application essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of the present application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A receiving apparatus in a wireless communication system, comprising:
a processor; and
a non-transitory computer readable storage medium storing program codes for execution by the processor,
wherein the program codes include instructions for:
receiving a code sequence having a length of N input bits, wherein the code sequence is obtained by encoding a quantity of information bits in an encoder at a transmitting apparatus in the wireless communication system;
dividing the code sequence into m subcodes that are coupled to each other, wherein each subcode has a length of N/m, and wherein each of N and m is an integer power of 2, and N>m;
separately calculating, for the m subcodes, squared Euclidean distances of input bits that are independent of each other in the m subcodes, to obtain minimum squared Euclidean distances of the input bits that are independent of each other in the m subcodes, wherein the minimum squared Euclidean distances of the input bits that are independent of each other in the m subcodes are collectively referred to as independent minimum squared Euclidean distances;

obtaining, according to the m independent minimum squared Euclidean distances, a minimum squared Euclidean distance of input bits that are coupled to each other in the m subcodes, wherein the minimum squared Euclidean distance of the input bits that are coupled to each other in the subcodes is referred to as a combined minimum squared Euclidean distance; and obtaining input bits that are in the m subcodes and that meet the independent minimum squared Euclidean distances and the combined minimum squared Euclidean distance, and obtaining a decoding result of the code sequence according to relationships between the m subcodes and the code sequence.

2. The receiving apparatus according to claim 1, wherein separately calculating the independent minimum squared Euclidean distances comprises:

calculating the independent minimum squared Euclidean distances in parallel.

3. The receiving apparatus according to claim 1, wherein m is 2, 4, or 8.

4. The receiving apparatus according to claim 3, wherein m is 2, wherein the code sequence is expressed by a formula:

$$x_1^N = v_1^N \times \begin{bmatrix} F^{\otimes(n-1)} & 0 \\ F^{\otimes(n-1)} & F^{\otimes(n-1)} \end{bmatrix} = [(v_1^{N/2} \oplus v_{N/2+1}^N)F^{\otimes(n-1)} \quad v_{N/2+1}^N F^{\otimes(n-1)}],$$

wherein dividing the code sequence into m subcodes comprises:

dividing the code sequence into a first subcode and a second subcode, wherein input bits corresponding to the two subcodes are $a_k$ and $b_k$ respectively, and are expressed by formulas $a_1^{N/2} = v_1^{N/2} \oplus v_{N/2+1}^N$ and $b_1^{N/2} = v_{N/2+1}^N$;

wherein separately calculating the independent minimum squared Euclidean distances comprises:

for input bits $a_k, k \in \Omega_{11}^{(1)}$ that are in the first subcode and that are independent of any input bit in the second subcode, performing a calculation to obtain a first independent minimum squared Euclidean distance $$E_a(a_k, k \in \Omega_{01}^{(1)}) = \min_{a_k, k \in \Omega_{11}^{(1)}} D_1^{N/2};$$

and for input bits $b_k, k \in \Omega_{11}^{(1)}$ that are in the second subcode and that are independent of any input bit in the first subcode, performing a calculation to obtain a second independent minimum squared Euclidean distance $$E_b(b_k, k \in \Omega_{01}^{(1)}) = \min_{b_k, k \in \Omega_{11}^{(1)}} D_{N/2+1}^N;$$

wherein obtaining the combined minimum squared Euclidean distance comprises:

combining the first independent minimum squared Euclidean distance and the second independent minimum squared Euclidean distance $E_a$, $E_b$, to obtain $E_{sum}$ that is expressed by a formula $E_{sum}(a_k = b_k, k \in \Omega_{01}^{(1)}) = E_a(a_k, k \in \Omega_{01}^{(1)}) + E_b(b_k, k \in \Omega_{01}^{(1)});$ and performing a search to obtain a combined minimum squared Euclidean distance that is expressed by a formula $$\min_{a_k = b_k, k \in \Omega_{01}^{(1)}} E_{sum}(a_k = b_k, k \in \Omega_{01}^{(1)});$$

and wherein obtaining input bits that are in the first and second subcodes and that meet the independent minimum squared Euclidean distances and the combined minimum squared Euclidean distance, and obtaining the decoding result of the code sequence comprises:

obtaining input bits $a_k = b_k, k \in \Omega_{01}^{(1)}$ that are coupled to each other in the first subcode and the second subcode and that meet the combined minimum squared Euclidean distance;

obtaining input bits $a_k, b_k, k \in \Omega_{11}^{(1)}$ that are independent of each other in the first subcode and the second subcode and that meet the first independent minimum squared Euclidean distance $E_a$ and the second independent minimum squared Euclidean distance $E_b$; and obtaining decoding results $v_1^{N/2}$ and $v_{N/2+1}^N$ of the code sequence by using relationships $b_1^{N/2} = v_{N/2+1}^N$ and $a_1^{N/2} = v_1^{N/2} \oplus v_{N/2+1}^N$ between the two subcodes and the Polar code sequence;

wherein in the above formulas, the N is the length of the code sequence, $v_1^N$ are input bits, bit 1 to bit N, in the code sequence, including information bits and frozen bits;

$$\begin{bmatrix} F^{\otimes(n-1)} & 0 \\ F^{\otimes(n-1)} & F^{\otimes(n-1)} \end{bmatrix}$$

is a generator matrix for the code sequence, and wherein $v_1^{N/2}$ are input bits of the first subcode, which are the bit 1 to bit N/2 in the code sequence, $v_{N/2+1}^N$ are input bits of the second subcode, which are the bit N/2+1 to bit N in the code sequence;

the index set $\Omega_{01}^{(1)}$ represents that $v_k$ is a frozen bit and $v_{k+N/2}$ is an information bit and the index set $\Omega_{11}^{(1)}$ represents that $v_k$ is an information bit and $v_{k+N/2}$ is an information bit.

5. The decoding apparatus according to claim 3, wherein m is 4, wherein receiving and dividing the code sequence into m subcodes comprises:

receiving the code sequence, and dividing the code sequence into four subcodes that are coupled to each other, wherein each subcode has a length of N/4, N is an integer power of 2, and the code sequence is expressed by a formula $$x_1^N = v_1^N \times \begin{bmatrix} F^{\otimes(n-1)} & 0 \\ F^{\otimes(n-1)} & F^{\otimes(n-1)} \end{bmatrix} = [(v_1^{N/2} \oplus v_{N/2+1}^N)F^{\otimes(n-1)} \quad v_{N/2+1}^N F^{\otimes(n-1)}],$$

and wherein the four subcodes are a third subcode, a fourth subcode, a fifth subcode, and a sixth subcode, and the input bits of the third subcode, the fourth subcode, the fifth subcode, and the sixth subcode are: $c_k$, $d_k$, $e_k$, and $f_k$, respectively;

wherein separately calculating the independent minimum squared Euclidean distances comprises:
separately calculating the independent minimum squared Euclidean distances for input bits that are independent of each other in the third subcode, the fourth subcode, the fifth subcode, and the sixth subcode, to obtain
a first independent minimum squared Euclidean distance $$E_c = \min_{c_k, k \in \Omega_{11}^{(2)}} D_1^{N/4},$$

a second independent minimum squared Euclidean distance $$E_d = \min_{d_k, k \in \Omega_{11}^{(2)}} D_{N/4+1}^{N/2},$$

a third independent minimum squared Euclidean distance $$E_e = \min_{e_k, k \in \Omega_{11}^{(2)}} D_{N/2+1}^{3N/4},$$

and
a fourth independent minimum squared Euclidean distance $$E_f = \min_{f_k, k \in \Omega_{11}^{(2)}} D_{3N/4+1}^{N},$$

wherein an index set $\Omega_{11}^{(2)}$ represents all indexes meeting $k \in \Omega_{11}^{(1)}$ and $k+N/4 \in \Omega_{11}^{(1)}$, and an index set $\Omega_{11}^{(1)}$ represents that $v_k$ is an information bit and $v_{k+N/2}$ is an information bit, wherein $1 \leq k \leq N/4$;
wherein obtaining the combined minimum squared Euclidean distance comprises:
performing a calculation to obtain a sum of squared Euclidean distances of the third subcode and the fourth subcode, wherein the sum is expressed by a formula $E_{sum1} = E_c + E_d$, and for input bits that are coupled to each other in the third subcode and the fourth subcode, performing a search to obtain a first combined minimum squared Euclidean distance that is expressed by a formula $$E_{sum2} = \min_{a_k, k \in \Omega_{01}^{(2)}} E_{sum1},$$

wherein $\Omega_{01}^{(2)}$ represents all indexes meeting $k \notin \Omega_{11}^{(1)}$ and $k+N/4 \in \Omega_{11}^{(1)}$, wherein $1 \leq k \leq N/4$;
performing a calculation to obtain a sum of squared Euclidean distances of the fifth subcode and the sixth subcode, wherein the sum is expressed by a formula $E_{sum3} = E_e + E_f$, and for input bits that are coupled to each other in the fifth subcode and the sixth subcode, performing a search to obtain a second combined minimum squared Euclidean distance that is expressed by a formula $$E_{sum4} = \min_{b_k, k \in \Omega_{01}^{(2)}} E_{sum3},$$

wherein $\Omega_{01}^{(2)}$ represents all indexes meeting $k \notin \Omega_{11}^{(1)}$ and $k+N/4 \notin \Omega_{11}^{(1)}$, wherein $1 \leq k \leq N/4$;
for input bits that are coupled to each other in the third to sixth subcodes, calculating a total squared Euclidean distance that is expressed by a formula $E_{sum}(a_k = b_k, k \notin \Omega_{01}^{(1)}) = E_{sum2} + E_{sum4}$, and performing a search to obtain a third combined minimum squared Euclidean distance $$\min_{a_k = b_k, k \in \Omega_{01}^{(1)}} E_{sum}(a_k = b_k, k \in \Omega_{01}^{(1)}),$$

wherein an index set $\Omega_{01}^{(1)}$ represents that $v_k$ is a frozen bit and $v_{k+N/2}$ is an information bit; and
wherein obtaining the decoding result of the code sequence comprises:
obtaining input bits $a_k = b_k, k \in \Omega_{01}^{(1)}$ meeting the third combined minimum squared Euclidean distance $$\min_{a_k = b_k, k \in \Omega_{01}^{(1)}} E_{sum}(a_k = b_k, k \in \Omega_{01}^{(1)});$$

separately substituting the input bits $a_k = b_k, k \in \Omega_{01}^{(1)}$ into the first combined minimum squared Euclidean distance $E_{sum2}$ and the second combined minimum squared Euclidean distance $E_{sum4}$ to obtain other input bits; and
after all input bits $c_k$, $d_k$, $e_k$, and $f_k$ are obtained, obtaining input bits $v_1^N$ of the code sequence according to relationships $$\begin{cases} v_k = c_k \oplus d_k \oplus e_k \oplus f_k \\ v_{k+N/4} = d_k \oplus f_k \\ v_{k+N/2} = e_k \oplus f_k \\ v_{k+3N/4} = f_k \end{cases}$$

between the third to sixth subcodes and the code sequence;
wherein in the above formulas,
the N is the length of the code sequence, $v_1^N$ are input bits, bit 1 to bit N, in the code sequence, including information bits and frozen bits;

$$\begin{bmatrix} F^{\otimes(n-1)} & 0 \\ F^{\otimes(n-1)} & F^{\otimes(n-1)} \end{bmatrix}$$

is a generator matrix for the code sequence,
and wherein the $v_1^{N/2}$ are input bits of the first subcode, which are the bit 1 to bit N/2 in the transmission block, $v_{N/2+1}^N$ are input bits of the second subcode, which are the bit N/2+1 to bit N in the code sequence.

6. The receiving apparatus according to claim 1, wherein the program codes further comprise instructions for:
dividing a code sequence having a length of S into N subcodes, wherein each subcode has a length of S/N, and separately performing successive cancellation (SC) decoding on the N subcodes to obtain N SC decoding results, wherein each of S and N is an integer powers of 2, before dividing the code sequence having the length of N into m subcodes;
wherein all input bits in the N SC decoding results are used as the code sequence having the length of N.

7. The decoding apparatus according to claim 5, wherein dividing the code sequence into four subcodes comprises:
dividing the code sequence into a first subcode and a second subcode, wherein input bits corresponding to the two subcodes are $a_k$ and $b_k$ respectively, and are expressed by formulas $$a_1^{N/2}=v_1^{N/2}\oplus v_{N/2+1}^{N} \text{ and } b_1^{N/2}=v_{N/2+1}^{N}; \text{ and}$$

dividing the first subcode into the third subcode and the fourth subcode, and dividing the second subcode into the fifth subcode and the sixth subcode, wherein input bits of the third subcode, the fourth subcode, the fifth subcode, and the sixth subcode are:
$c_k$ that is expressed by a formula $c_k=a_k\oplus a_{k+N/4}$,
$d_k$ that is expressed by a formula $d_k=a_{k+N/4}$,
$e_k$ that is expressed by a formula $e_k=b_k\oplus b_{k+N/4}$, and
$f_k$ that is expressed by a formula, $f_k=b_{k+N/4}$, respectively, wherein $1\leq k\leq N/4$, $a_1^{N/2}=v_1^{N/2}\oplus v_{N/2+1}^{N}$, and $b_1^{N/2}=v_{N/2+1}^{N}$.

8. A method for decoding a code sequence, comprising:
receiving a code sequence having a length of N input bits, wherein the code sequence is obtained by encoding a quantity of information bits in an encoder at a transmitting apparatus in the wireless communication system;
dividing the code sequence into m subcodes that are coupled to each other, wherein each subcode has a length of N/m, and wherein each of N and m is an integer powers of 2, and N>m;
separately calculating, for the m subcodes of the code sequence, squared Euclidean distances of input bits that are independent of each other in the m subcodes, to obtain minimum squared Euclidean distances of the input bits that are independent of each other in the m subcodes, wherein the minimum squared Euclidean distances of the input bits that are independent of each other in the m subcodes are collectively referred to as independent minimum squared Euclidean distances;
obtaining, according to the m independent minimum squared Euclidean distances, a minimum squared Euclidean distance of input bits that are coupled to each other in the m subcodes, wherein the minimum squared Euclidean distance of the input bits that are coupled to each other in the m subcodes is referred to as a combined minimum squared Euclidean distance; and
obtaining input bits that are in the m subcodes and that meet the independent minimum squared Euclidean distances and the combined minimum squared Euclidean distance, and obtaining a decoding result of the code sequence according to relationships between the m subcodes and the code sequence.

9. The method according to claim 8, wherein separately calculating the independent minimum squared Euclidean distances comprises:
calculating the independent minimum squared Euclidean distances in parallel.

10. The method according to claim 8, wherein m is 2, 4, or 8.

11. The method according to claim 10, wherein m is 2, wherein the code sequence is expressed by a formula:

$$x_1^N = v_1^N \times \begin{bmatrix} F^{\otimes(n-1)} & 0 \\ F^{\otimes(n-1)} & F^{\otimes(n-1)} \end{bmatrix} = \begin{bmatrix} (v_1^{N/2} \oplus v_{N/2+1}^N)F^{\otimes(n-1)} & v_{N/2+1}^N F^{\otimes(n-1)} \end{bmatrix},$$

wherein dividing the code sequence into m subcodes comprises:
dividing the code sequence into a first subcode and a second subcode, wherein input bits corresponding to the two subcodes are $a_k$ and $b_k$ respectively, and are expressed by formulas $$a_1^{N/2}=v_1^{N/2}\oplus v_{N/2+1}^{N} \text{ and } b_1^{N/2}=v_{N/2+1}^{N};$$

wherein separately calculating the independent minimum squared Euclidean distances comprises:
for input bits $a_k, k\in\Omega_{11}^{(1)}$ that are in the first subcode and that are independent of any input bit in the second subcode, performing a calculation to obtain a first independent minimum squared Euclidean distance $$E_a(a_k, k \in \Omega_{01}^{(1)}) = \min_{a_k, k\in\Omega_{11}^{(1)}} D_1^{N/2};$$

and
for input bits $b_k, k\in\Omega_{11}^{(1)}$ that are in the second subcode and that are independent of any input bit in the first subcode, performing a calculation to obtain a second independent minimum squared Euclidean distance $$E_b(b_k, k \in \Omega_{01}^{(1)}) = \min_{b_k, k\in\Omega_{11}^{(1)}} D_{N/2+1}^{N};$$

wherein obtaining the combined minimum squared Euclidean distance comprises:
combining the first independent minimum squared Euclidean distance and the second independent minimum squared Euclidean distance $E_a$, $E_b$, to obtain $$E_{sum}(a_k=b_k, k\in\Omega_{01}^{(1)})=E_a(a_k, k\in\Omega_{01}^{(1)})+E_b(b_k, k\in\Omega_{01}^{(1)}); \text{ and}$$

performing a search to obtain a first combined minimum squared Euclidean distance that is expressed by a formula $$\min_{a_k=b_k, k\in\Omega_{01}^{(1)}} E_{sum}(a_k = b_k, k \in \Omega_{01}^{(1)});$$

wherein obtaining input bits that are in the first and second subcodes and that meet the independent minimum squared Euclidean distances and the combined minimum squared Euclidean distance, and obtaining the decoding result of the code sequence comprises:
obtaining input bits $a_k=b_k, k\in\Omega_{01}^{(1)}$ that are coupled to each other in the first subcode and the second subcode and that meet the combined minimum squared Euclidean distance, wherein the first combined minimum squared Euclidean distance is expressed by a formula $$\min_{a_k=b_k, k\in\Omega_{01}^{(1)}} E_{sum}(a_k = b_k, k \in \Omega_{01}^{(1)});$$

obtaining input bits $a_k, b_k, k\in\Omega_{11}^{(1)}$ that are independent of each other in the first subcode and the second subcode and that meet the first independent minimum squared Euclidean distance $E_a$ and the second independent minimum squared Euclidean distance $E_b$; and obtaining decoding results $v_1^{N/2}$ and $v_{N/2+1}^{N}$ of the code sequence by using relationships $b_1^{N/2}=v_{N/2+1}^{N}$ and $a_1^{N/2}=v_1^{N/2}\oplus v_{N/2+1}^{N}$ between the two subcodes and the code sequence, wherein in the above formulas, the N is the length of the code sequence, $v_1^N$ are input bits, bit 1 to bit N, in the code sequence, including information bits and frozen bits;

$$\begin{bmatrix} F^{\otimes(n-1)} & 0 \\ F^{\otimes(n-1)} & F^{\otimes(n-1)} \end{bmatrix}$$

is a generator matrix for the code sequence, and wherein the $v_1^{N/2}$ are input bits of the first subcode, which are the bit 1 to bit N/2 in the code sequence, $v_{N/2+1}^{N}$ are input bits of the second subcode, which are the bit N/2+1 to bit N in the code sequence;

the index set $\Omega_{01}^{(1)}$ represents that $v_k$ is a frozen bit and $v_{k+N/2}$ is an information bit; and the index set $\Omega_{11}^{(1)}$ represents that $v_k$ is an information bit and $v_{k+N/2}$ is an information bit.

12. The method according to claim 10, wherein m is 4, wherein receiving and dividing the code sequence into m subcodes comprises:

receiving the code sequence, and dividing the code sequence into four subcodes that are coupled to each other, wherein each subcode has a length of N/4, N is an integer power of 2, and the code sequence is expressed by a formula $$x_1^N = v_1^N \times \begin{bmatrix} F^{\otimes(n-1)} & 0 \\ F^{\otimes(n-1)} & F^{\otimes(n-1)} \end{bmatrix} = \begin{bmatrix} (v_1^{N/2} \oplus v_{N/2+1}^N) F^{\otimes(n-1)} & v_{N/2+1}^N F^{\otimes(n-1)} \end{bmatrix},$$

and wherein the four subcodes are a third subcode, a fourth subcode, a fifth subcode, and a sixth subcode, and the input bits of the third subcode, the fourth subcode, the fifth subcode, and the sixth subcode are: $c_k$, $d_k$, $e_k$, and $f_k$, respectively;

wherein separately calculating the independent minimum squared Euclidean distances comprises:

separately calculating the independent minimum squared Euclidean distances for input bits that are independent of each other in the third subcode, the fourth subcode, the fifth subcode, and the sixth subcode, to obtain a first independent minimum squared Euclidean distance $$E_c = \min_{c_k, k \in \Omega_{11}^{(2)}} D_1^{N/4},$$

a second independent minimum squared Euclidean distance $$E_d = \min_{d_k, k \in \Omega_{11}^{(2)}} D_{N/4+1}^{N/2},$$

a third independent minimum squared Euclidean distance $$E_e = \min_{e_k, k \in \Omega_{11}^{(2)}} D_{N/2+1}^{3N/4},$$

and a fourth independent minimum squared Euclidean distance $$E_f = \min_{f_k, k \in \Omega_{11}^{(2)}} D_{3N/4+1}^{N},$$

wherein an index set $\Omega_{11}^{(2)}$ represents all indexes meeting $k \in \Omega_{11}^{(1)}$ and $k+N/4 \in \Omega_{11}^{(1)}$, and an index set $\Omega_{11}^{(1)}$ represents that $v_k$ is an information bit and $v_{k+N/2}$ is an information bit, wherein $1 \leq k \leq N/4$;

wherein obtaining the combined minimum squared Euclidean distance comprises:

performing a calculation to obtain a sum of squared Euclidean distances of the third subcode and the fourth subcode, wherein the sum is expressed by a formula $E_{sum1} = E_c + E_d$, and for input bits that are coupled to each other in the third subcode and the fourth subcode, performing a search to obtain a first combined minimum squared Euclidean distance that is expressed by a formula $$E_{sum2} = \min_{a_k, k \in \Omega_{01}^{(2)}} E_{sum1},$$

wherein $\Omega_{01}^{(2)}$ represents all indexes meeting $k \notin \Omega_{11}^{(1)}$ and $k+N/4 \in \Omega_{11}^{(1)}$, wherein $1 \leq k \leq N/4$;

performing a calculation to obtain a sum of squared Euclidean distances of the fifth subcode and the sixth subcode, wherein the sum is expressed by a formula $E_{sum3} = E_e + E_f$, and for input bits that are coupled to each other in the fifth subcode and the sixth subcode, performing a search to obtain a second combined minimum squared Euclidean distance that is expressed by a formula $$E_{sum4} = \min_{b_k, k \in \Omega_{01}^{(2)}} E_{sum3},$$

wherein $\Omega_{01}^{(2)}$ represents all indexes meeting $k \notin \Omega_{11}^{(1)}$ and $k+N/4 \in \Omega_{11}^{(1)}$, wherein $1 \leq k \leq N/4$;

for input bits that are coupled to each other in the third to sixth subcodes, calculating a total squared Euclidean distance that is expressed by a formula $E_{sum}(a_k=b_k, k \in \Omega_{01}^{(1)}) = E_{sum2} + E_{sum4}$, and performing a search to obtain a third combined minimum squared Euclidean distance $$\min_{a_k=b_k, k \in \Omega_{01}^{(1)}} E_{sum}(a_k = b_k, k \in \Omega_{01}^{(1)}),$$

wherein an index set $\Omega_{11}^{(1)}$ represents that $v_k$ is a frozen bit, and $v_{k+N/2}$ is an information bit; and wherein obtaining the decoding result of the code sequence comprises:

obtaining input bits $a_k=b_k, k \in \Omega_{01}^{(1)}$ meeting the third combined minimum squared Euclidean distance $$\min_{a_k=b_k, k \in \Omega_{01}^{(1)}} E_{sum}(a_k = b_k, k \in \Omega_{01}^{(1)});$$

separately substituting the input bits $a_k=b_k, k \in \Omega_{01}^{(1)}$ into the first combined minimum squared Euclidean distance $E_{sum2}$ and the second combined minimum squared Euclidean distance $E_{sum4}$ to obtain other input bits; and after all input bits $c_k$, $d_k$, $e_k$, and $f_k$ are obtained, obtaining input bits $v_1^N$ of the code sequence according to relationships $$\begin{cases} v_k = c_k \oplus d_k \oplus e_k \oplus f_k \\ v_{k+N/4} = d_k \oplus f_k \\ v_{k+N/2} = e_k \oplus f_k \\ v_{k+3N/4} = f_k \end{cases}$$

between the third to sixth subcodes and code sequence; wherein in the above formulas, the N is the length of the code sequence, $v_1^N$ are input bits, bit 1 to bit N, in the code sequence, including information bits and frozen bits;

$$\begin{bmatrix} F^{\otimes(n-1)} & 0 \\ F^{\otimes(n-1)} & F^{\otimes(n-1)} \end{bmatrix}$$

is a generator matrix of the code sequence, and wherein the $v_1^{N/2}$ are input bits of the first subblock, which are the bit 1 to bit N/2 in the transmission block, $v_{N/2+1}^N$ are input bits of the second subblock, which are the bit N/2+1 to bit N in the transmission block.

13. The method according to claim 8, wherein before receiving and dividing the code sequence having the length of N into m subcodes, the method further comprises:

dividing a code sequence having a length of S into N subcodes, wherein each subcode has a length of S/N, and separately performing successive cancellation (SC) decoding to obtain N SC decoding results, and using all input bits in the N SC decoding results as the code sequence having the length of N;

wherein a decoding result of the code sequence having the length of S is obtained according to all of the input bits, wherein each of S and N is an integer powers of 2.

14. The method according to claim 12, wherein dividing the code sequence into four subcodes comprises:

dividing the code sequence into a first subcode and a second subcode, wherein input bits corresponding to the two subcodes are $a_k$ and $b_k$ respectively, and are expressed by formulas $a_1^{N/2} = v_1^{N/2} \oplus v_{N/2+1}^N$ and $b_1^{N/2} = v_{N/2+1}^N$; and dividing the first subcode into the third subcode and the fourth subcode, and dividing the second subcode into the fifth subcode and the sixth subcode, wherein input bits of the third subcode, the fourth subcode, the fifth subcode, and the sixth subcode are:

$c_k$ that is expressed by a formula $c_k = a_k \oplus a_{k+N/4}$, $d_k$ that is expressed by a formula $d_k = a_{k+N/4}$, $e_k$ that is expressed by a formula $e_k = b_k \oplus b_{k+N/4}$, and $f_k$ that is expressed by a formula, $f_k = b_{k+N/4}$, respectively, wherein $1 \le k \le N/4$, $a_1^{N/2} = v_1^{N/2} \oplus v_{N/2+1}^N$, and $b_1^{N/2} = v_{N/2+1}^N$.

* * * * *